US009437263B2

(12) United States Patent
Eckel

(10) Patent No.: US 9,437,263 B2
(45) Date of Patent: *Sep. 6, 2016

(54) APPARATUSES AND METHODS FOR PROVIDING STROBE SIGNALS TO MEMORIES

(71) Applicant: Micron Technology, Inc., Boise, ID (US)

(72) Inventor: Nathan A. Eckel, Lino Lakes, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/871,723

(22) Filed: Sep. 30, 2015

(65) Prior Publication Data
US 2016/0027486 A1    Jan. 28, 2016

Related U.S. Application Data

(63) Continuation of application No. 14/015,599, filed on Aug. 30, 2013, now Pat. No. 9,171,597.

(51) Int. Cl.
*G11C 7/00* (2006.01)
*G11C 7/22* (2006.01)

(52) U.S. Cl.
CPC ............ *G11C 7/22* (2013.01); *G11C 7/222* (2013.01)

(58) Field of Classification Search
CPC .................................. G11C 7/222; G11C 7/22
USPC ......................................... 365/193, 194, 198
See application file for complete search history.

(56) References Cited

U.S. PATENT DOCUMENTS

| 5,179,303 | A | 1/1993 | Searles et al. |
| 5,263,032 | A | 11/1993 | Porter et al. |
| 5,748,914 | A | 5/1998 | Barth et al. |
| 5,774,475 | A | 6/1998 | Qureshi |
| 5,960,008 | A | 9/1999 | Osawa et al. |
| 5,982,684 | A | 11/1999 | Schwartzlow et al. |

(Continued)

FOREIGN PATENT DOCUMENTS

| JP | 05-265872 | 10/1993 |
| JP | 0774620 A | 3/1995 |

(Continued)

OTHER PUBLICATIONS

Extended European Search Report dated Apr. 16, 2015 received for 09774013.8.

*Primary Examiner* — Toan Le
(74) *Attorney, Agent, or Firm* — Dorsey & Whitney LLP

(57) ABSTRACT

Apparatuses and methods for providing strobe signals to memories are described herein. An example apparatus may include a plurality of memories and a memory controller. The memory controller may be coupled to the plurality of memories and configured to receive an input clock signal. The memory controller may further be configured to provide a timing strobe signal having a delay relative to the input clock signal to a memory of the plurality of memories. The memory controller may further be configured to receive a return strobe signal from the plurality of memories. In some examples, the return strobe signal may be based at least in part on the timing strobe signal and the memory controller may be configured to adjust the delay based, at least in part, on a phase difference of the input clock signal and the return strobe signal.

15 Claims, 3 Drawing Sheets

(56) References Cited

U.S. PATENT DOCUMENTS

| | | | |
|---|---|---|---|
| 6,052,329 A | 4/2000 | Nishino et al. |
| 6,122,688 A | 9/2000 | Barth et al. |
| 6,177,807 B1 | 1/2001 | Bertin et al. |
| 6,181,616 B1 | 1/2001 | Byrd |
| 6,247,138 B1 | 6/2001 | Tamura et al. |
| 6,285,211 B1 | 9/2001 | Sample |
| 6,329,859 B1 | 12/2001 | Wu |
| 6,363,017 B2 | 3/2002 | Polney |
| 6,369,627 B1 | 4/2002 | Tomita |
| 6,380,783 B1 | 4/2002 | Chao et al. |
| 6,401,213 B1 | 6/2002 | Jeddeloh |
| 6,418,068 B1 | 7/2002 | Raynham |
| 6,519,194 B2 | 2/2003 | Tsujino et al. |
| 6,570,425 B2 | 5/2003 | Yamaguchi |
| 6,574,626 B1 | 6/2003 | Regelman et al. |
| 6,650,157 B2 | 11/2003 | Amick et al. |
| 6,658,523 B2 | 12/2003 | Janzen et al. |
| 6,839,260 B2 | 1/2005 | Ishii |
| 6,882,304 B2 | 4/2005 | Winter et al. |
| 6,889,334 B1 | 5/2005 | Magro et al. |
| 6,907,555 B1 | 6/2005 | Nomura et al. |
| 7,058,865 B2 | 6/2006 | Mori et al. |
| 7,107,424 B1 | 9/2006 | Avakian et al. |
| 7,135,905 B2 | 11/2006 | Teo et al. |
| 7,149,134 B2 | 12/2006 | Streif et al. |
| 7,168,005 B2 | 1/2007 | Adams et al. |
| 7,171,596 B2 | 1/2007 | Boehler |
| 7,184,916 B2 | 2/2007 | Resnick et al. |
| 7,197,101 B2 | 3/2007 | Glenn et al. |
| 7,203,259 B2 | 4/2007 | Glenn et al. |
| 7,205,811 B2 | 4/2007 | Freyman et al. |
| 7,243,469 B2 | 7/2007 | Miller et al. |
| 7,269,094 B2 * | 9/2007 | Lin .................. G11C 7/1006 365/191 |
| 7,323,917 B2 | 1/2008 | Cho et al. |
| 7,389,375 B2 | 6/2008 | Gower et al. |
| 7,423,469 B2 | 9/2008 | Pickering et al. |
| 7,464,241 B2 | 12/2008 | Pete |
| 7,466,179 B2 | 12/2008 | Huang et al. |
| 7,489,743 B2 | 2/2009 | Koh et al. |
| 7,567,476 B2 | 7/2009 | Ishikawa |
| 7,697,369 B2 | 4/2010 | Koshizuka |
| 7,710,144 B2 | 5/2010 | Dreps et al. |
| 7,764,564 B2 | 7/2010 | Saito et al. |
| 7,772,907 B2 | 8/2010 | Kim et al. |
| 7,853,836 B2 | 12/2010 | Takada |
| 7,855,931 B2 | 12/2010 | LaBerge et al. |
| 7,979,757 B2 | 7/2011 | Jeddeloh |
| 8,010,866 B2 | 8/2011 | LaBerge |
| 8,127,204 B2 | 2/2012 | Hargan |
| 8,134,876 B2 * | 3/2012 | Choi .................. H03L 7/00 365/193 |
| 8,248,138 B2 | 8/2012 | Liu |
| 8,289,760 B2 | 10/2012 | Jeddeloh |
| 8,315,347 B2 | 11/2012 | Canagasaby et al. |
| 8,356,138 B1 | 1/2013 | Kulkarni et al. |
| 8,400,808 B2 | 3/2013 | King |
| 8,570,881 B2 | 10/2013 | Talbot et al. |
| 9,146,811 B2 | 9/2015 | LaBerge et al. |
| 9,171,597 B2 * | 10/2015 | Eckel .................. G11C 7/22 |
| 2001/0033030 A1 | 10/2001 | Leedy |
| 2002/0004893 A1 | 1/2002 | Chang |
| 2002/0054516 A1 | 5/2002 | Taruishi et al. |
| 2002/0097613 A1 | 7/2002 | Raynham |
| 2002/0125933 A1 | 9/2002 | Tamura et al. |
| 2002/0130687 A1 | 9/2002 | Duesman |
| 2002/0133666 A1 | 9/2002 | Janzen et al. |
| 2002/0138688 A1 | 9/2002 | Hsu et al. |
| 2003/0041299 A1 | 2/2003 | Kanazawa et al. |
| 2003/0132790 A1 | 7/2003 | Amick et al. |
| 2004/0073767 A1 | 4/2004 | Johnson et al. |
| 2004/0098545 A1 | 5/2004 | Pline et al. |
| 2004/0160833 A1 | 8/2004 | Suzuki |
| 2004/0168101 A1 | 8/2004 | Kubo |
| 2004/0199840 A1 | 10/2004 | Takeoka et al. |
| 2004/0206982 A1 | 10/2004 | Lee et al. |
| 2004/0237023 A1 | 11/2004 | Takahashi et al. |
| 2004/0246026 A1 | 12/2004 | Wang et al. |
| 2004/0252689 A1 | 12/2004 | Park et al. |
| 2005/0005230 A1 | 1/2005 | Koga et al. |
| 2005/0071707 A1 | 3/2005 | Hampel |
| 2005/0091471 A1 | 4/2005 | Conner et al. |
| 2005/0144546 A1 | 6/2005 | Igeta et al. |
| 2005/0157560 A1 | 7/2005 | Hosono et al. |
| 2005/0174877 A1 | 8/2005 | Cho et al. |
| 2005/0278490 A1 | 12/2005 | Murayama |
| 2005/0289435 A1 | 12/2005 | Mulla et al. |
| 2006/0028864 A1 | 2/2006 | Rinerson et al. |
| 2006/0036827 A1 | 2/2006 | Dell et al. |
| 2006/0041799 A1 | 2/2006 | Sato |
| 2006/0056247 A1 | 3/2006 | Satoh |
| 2006/0059406 A1 | 3/2006 | Micheloni et al. |
| 2006/0123320 A1 | 6/2006 | Vogt |
| 2006/0126369 A1 | 6/2006 | Raghuram |
| 2006/0233012 A1 | 10/2006 | Sekiguchi et al. |
| 2006/0245291 A1 | 11/2006 | Sakaitani |
| 2006/0253723 A1 | 11/2006 | Wu et al. |
| 2006/0262587 A1 | 11/2006 | Matsui et al. |
| 2006/0273455 A1 | 12/2006 | Williams et al. |
| 2007/0058410 A1 | 3/2007 | Rajan |
| 2007/0070669 A1 | 3/2007 | Tsern |
| 2007/0074093 A1 | 3/2007 | Lasser |
| 2007/0136645 A1 | 6/2007 | Hsueh et al. |
| 2007/0153951 A1 | 7/2007 | Lim et al. |
| 2007/0271424 A1 | 11/2007 | Lee et al. |
| 2008/0080261 A1 | 4/2008 | Shaeffer et al. |
| 2008/0147897 A1 | 6/2008 | Talbot |
| 2008/0150088 A1 | 6/2008 | Reed et al. |
| 2008/0201548 A1 | 8/2008 | Przybylski et al. |
| 2008/0250292 A1 | 10/2008 | Djordjevic |
| 2008/0270842 A1 | 10/2008 | Ho et al. |
| 2009/0006775 A1 | 1/2009 | Bartley et al. |
| 2009/0016130 A1 | 1/2009 | Menke et al. |
| 2009/0021992 A1 | 1/2009 | Oh |
| 2009/0091968 A1 | 4/2009 | Dietrich et al. |
| 2009/0196093 A1 | 8/2009 | Happ et al. |
| 2009/0244997 A1 | 10/2009 | Searles et al. |
| 2009/0251189 A1 | 10/2009 | Hsieh |
| 2009/0296867 A1 | 12/2009 | Do et al. |
| 2009/0300314 A1 | 12/2009 | Laberge et al. |
| 2009/0300444 A1 | 12/2009 | Jeddeloh |
| 2010/0005217 A1 | 1/2010 | Jeddeloh |
| 2010/0005376 A1 | 1/2010 | Laberge et al. |
| 2010/0014364 A1 | 1/2010 | Laberge et al. |
| 2010/0031129 A1 | 2/2010 | Hargan |
| 2010/0042889 A1 | 2/2010 | Hargan |
| 2010/0070696 A1 | 3/2010 | Blankenship |
| 2010/0079180 A1 | 4/2010 | Kim et al. |
| 2010/0091537 A1 | 4/2010 | Best et al. |
| 2010/0110748 A1 | 5/2010 | Best |
| 2010/0156488 A1 | 6/2010 | Kim et al. |
| 2010/0176893 A1 | 7/2010 | Nose |
| 2010/0271092 A1 | 10/2010 | Zerbe et al. |
| 2010/0308880 A1 | 12/2010 | Wang et al. |
| 2011/0075497 A1 | 3/2011 | Laberge |
| 2011/0148486 A1 | 6/2011 | Mosalikanti et al. |
| 2011/0271158 A1 | 11/2011 | Jeddeloh |
| 2011/0296227 A1 | 12/2011 | LaBerge et al. |
| 2012/0144276 A1 | 6/2012 | Hargan |
| 2012/0155142 A1 | 6/2012 | King |
| 2013/0208549 A1 | 8/2013 | King |
| 2013/0318298 A1 | 11/2013 | LaBerge et al. |
| 2013/0346722 A1 | 12/2013 | LaBerge et al. |
| 2014/0053040 A1 | 2/2014 | Hargan |
| 2014/0258666 A1 | 9/2014 | LaBerge |
| 2014/0298119 A1 | 10/2014 | LaBerge et al. |
| 2014/0337570 A1 | 11/2014 | LaBerge et al. |
| 2015/0028928 A1 | 1/2015 | King |

FOREIGN PATENT DOCUMENTS

| | | |
|---|---|---|
| JP | 11-102599 | 4/1999 |
| JP | 2004-327474 | 11/2004 |
| JP | 2007-140948 | 6/2007 |

(56) References Cited

FOREIGN PATENT DOCUMENTS

| JP | 2007-226876 | 9/2007 |
| JP | 2007-328636 | 12/2007 |
| JP | 2008-112503 | 5/2008 |
| JP | 2008-140220 | 6/2008 |
| WO | 97/14289 | 4/1997 |
| WO | 2005/033958 | 4/2005 |
| WO | 2007028109 A2 | 3/2007 |
| WO | 2007/038225 A2 | 4/2007 |
| WO | 2007/095080 A2 | 8/2007 |
| WO | 2008/054696 A1 | 5/2008 |
| WO | 2008/076790 A2 | 6/2008 |
| WO | 2009/148863 A2 | 12/2009 |
| WO | 2010002561 A2 | 1/2010 |
| WO | 2010011503 A2 | 1/2010 |
| WO | 2012/060097 A1 | 5/2012 |
| WO | 2012/082338 A3 | 6/2012 |

\* cited by examiner

APPARATUSES AND METHODS FOR PROVIDING STROBE SIGNALS TO MEMORIES

CROSS-REFERENCE TO RELATED APPLICATION

This application is a continuation of U.S. patent application Ser. No. 14/015,599, filed Aug. 30, 2013, U.S. Pat. No. 9,171,597 issued on Oct. 27, 2015. This application and patent are incorporated by reference herein in their entirety and for all purposes.

BACKGROUND

In typical memory systems, a memory controller may interface with a plurality of memories, and in this manner, the memory controller may provide write data to and receive read data from each of the memories in response to respective memory commands. However, due to differences in sensitivity for each of the memories to variations in process, voltage, and/or temperature, and also due to changing operating conditions (e.g., changing voltage and/or temperature) for each of the memories during operation, increasing the operating speeds of such systems to improve performance has proven problematic. For example, because the response to process, voltage, and/or temperature variation may be different, and the operating conditions for each memory of a memory system may change dynamically, memory performance may vary over a relatively large range. While a variety of approaches have been implemented in memory systems to compensate for different sensitivities to process, voltage, and/or temperature variation, as well as for changing operating conditions, improved approaches may still yet be desired.

DETAILED DESCRIPTION

Apparatuses and methods for providing strobe signals to memories are described herein. Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
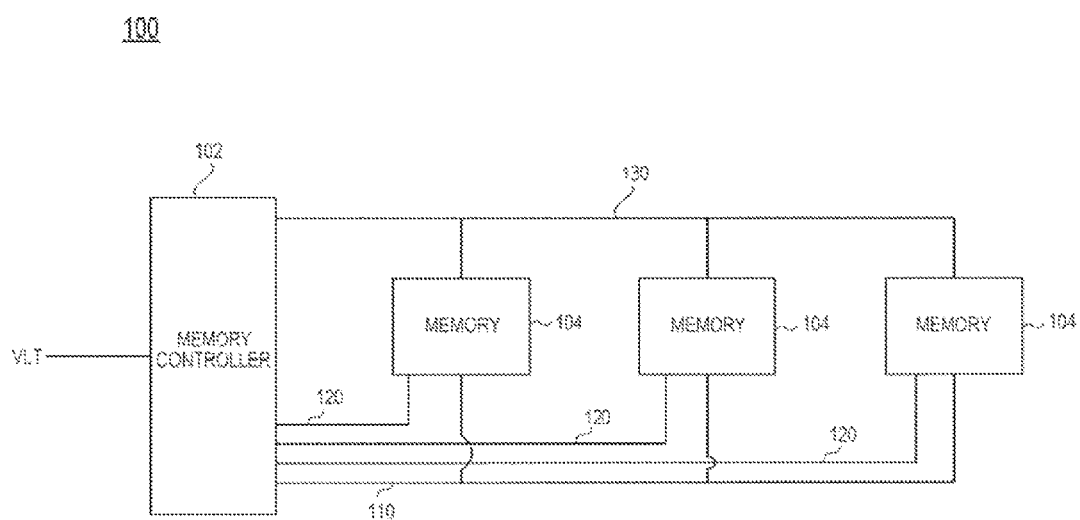
FIG. 1 is a block diagram of an apparatus according to an embodiment of the present invention.

FIG. 1 is a block diagram of an apparatus 100 according to an embodiment of the present invention. The apparatus 100 may include a memory controller 102 and a plurality of memories 104. As used herein, the term "apparatus" may refer to, for example, an integrated circuit, a memory device, a memory system, an electronic device or system, a smart phone, a tablet, a computer, a server, or a combination thereof.

The memory controller 102 may be included in memory control logic (not shown in FIG. 1) configured to control operation of the memories 104, for example, by providing memory commands and memory addresses to the memories 104 to perform memory operations. The memory controller 102 may be configured to provide timing signals associated with controlling the timing of the memory operations. For example, the memory controller 102 may provide timing signals to the memories 104 to perform memory operations, such as read operations to read data from the memories 104 and write operations to write data to the memories 104. The memory controller 102 may be configured operate in accordance with a system clock signal VLT. Each of the memories 104 may include a memory array to which data may be written and from which data may be read. The memories 104 may be or include in some embodiments volatile memory (e.g., dynamic random access memory (DRAM), static random access memory (SRAM)). In some embodiments, the memories 104 may be or include non-volatile memory (e.g., NOR flash, NAND flash, phase change memory).

The memory controller 102 may be coupled to each of the memories 104 by a bus 110. The bus 110 may comprise a bidirectional bus and the memory controller 102 may be configured to provide data (e.g., write data) to and receive data (e.g., read data) from each of the memories 104 over the bus 110. The bus 110 may have any width, including 8-bits, 32-bits, 64-bits, or another bit-width.

The memory controller 102 may further be coupled to each of the memories 104 by a respective bus 120. The memory controller 102 may be configured to provide a timing strobe signal to a particular memory 104 over a respective bus 120 related to a memory operation. In some examples, providing a timing strobe signal may allow the memory controller 102 to control the manner in which data is provided to and/or received from each memory 104. By way of example, in at least one embodiment, a timing strobe signal may comprise a periodic signal (e.g., clock signal) and a memory 104 may provide data to the memory controller 102 responsive to the timing strobe signal. A memory 104 may, for instance, provide data over the bus 110 for a read operation responsive to each rising edge, falling edge, or combination thereof, of the timing strobe signal. In another example, the memory controller 102 may provide a timing strobe signal to cause data provided over the bus 110 to be received by the memory 104, such as for a write operation, responsive to each rising edge, falling edge, or combination thereof, of the timing strobe signal.

The memory controller 102 may further be coupled to each of the memories 104 by a bus 130. Each of the memories 104 may be configured to provide return strobe signals to the memory controller 102 over the bus 130. In some instances, a return strobe signal may control the manner in which the memory controller 102 receives read data provided over the bus 110 from one or more of the memories 104. By way of example, in at least one embodiment, a return strobe signal may comprise a periodic signal and the memory controller 102 may capture data on the bus 110 responsive to a return strobe signal. The memory controller 102 may, for instance, capture data from the bus 110 responsive to each rising edge, falling edge, or combination thereof, of the return strobe signal. In some examples, a return strobe signal may be based, at least in part, on a timing strobe signal.

In some examples, each of the memories 104 may be arranged in a stack configuration, with the memories 104 stacked on one another. Accordingly one or more of the busses 110, 120, and 130 may include one or more through-silicon-vias (TSVs). In some examples, one or more of the busses 110, 120, and 130 may comprise bond wires or other conductors. In some embodiments, the memories 104 are stacked on a memory controller 102, and are coupled by busses 110, 120, and 130, one or more of which may be a TSV.

In an example read operation of the apparatus 100, the memory controller 102 may provide (e.g., generate) a timing strobe signal to a memory 104 associated with the read operation. Responsive to the timing strobe signal, the memory 104 may access data stored in the array of the memory 104 and provide the data as read data on the bus 110. The memory 104 may further provide a return strobe signal on the bus 130. As described, the return strobe signal may be based, at least in part, on the timing strobe signal. In some embodiments, the memory 104 may receive the timing strobe signal and the timing strobe signal may be used by the memory (e.g., to clock memory circuits) to provide read data from the memory 104. The timing strobe signal may further be used by the memory 104 to provide the return strobe signal. The memory controller 102 may capture the read data responsive to the return strobe signal. The read data may then be provided to an external device (not shown in FIG. 1), such as a processor.

In an example write operation of the apparatus 100, the memory controller 102 may provide a timing strobe signal to a memory 104 associated with the write operation. Write data for the write operation may be provided to the memory 104 associated with the write operation. In response to the strobe signal, the memory 104 may capture the write data according to the timing strobe signal and store the write data in the array of the memory 104. In some examples, the memory 104 may not provide a return strobe signal on the bus 130 responsive to storing the write data. In other examples, the memory 104 may provide a return strobe signal on the bus 130, for example, to indicate whether the write data was successfully stored.

In some examples, the memory controller 102 may be configured to delay timing strobe signals provided in association with read operations and write operations. Timing strobe signals provided in association with read operations (read timing strobe signals) may be provided during and/or after read operations, and timing strobe signals provided in associated with write operations (write timing strobe signals) may be provided during and/or after write operations. Each of the timing strike signals may be delayed by a respective delay, which may allow for separately changing the timing of memory operation for each memory 104. In this manner, the memory controller 102 may delay respective timing strobe signals to compensate for the different sensitivities to process, voltage, and temperature (PVT) variations of each memory 104. The memory controller 102 may further compensate for different operating conditions of each memory 104. For example, as described, the memories 104 may be arranged in a stack, and as a result, the temperature of each memory 104 may vary during operation based on the position of the memory in the stack. The timing of memory operations of each of the memories 104 may be changed, for example, so that read data for a read operation is provided by each of the memories 104 to the memory controller 102 at about the same time, relative to one another. Delays for the timing strobe signals provided in association with read operations may differ from delays for the timing strobe signals provided in association with write operations.

By way of example, and as will be explained in more detail below, the memory controller 102 may compare each return strobe signal to the clock signal VLT to determine the relative timing of memory operations for each memory 104. Each memory 104 may take a different time to perform a memory operation, which as previously discussed, may be due different sensitivities to process, voltage, and/or temperature (PVT) variations, as well as being subject to different voltage and/or temperature operating conditions. The memory controller 102 may accordingly adjust (e.g., delay) the time at which timing strobe signals are provided to each memory 104 to compensate for the changes. In examples where the memories 104 do not provide a return strobe signal in association with write operations, the memory controller 102 may adjust the time at which write timing strobe signals are provided to each memory 104 in association with write operations based, at least in part, on adjustments made to read timing strobe signals for read operations. For example, for a respective memory 104, the write timing strobe signal provided in association with write operations may be delayed less than the read timing strobe signal is delayed in association with read operations. In at least one embodiment, for each memory 104, timing strobe signals provided in association with write operations may be delayed half the delay applied to timing strobe signals provided in association with read operations.

Figure 2:
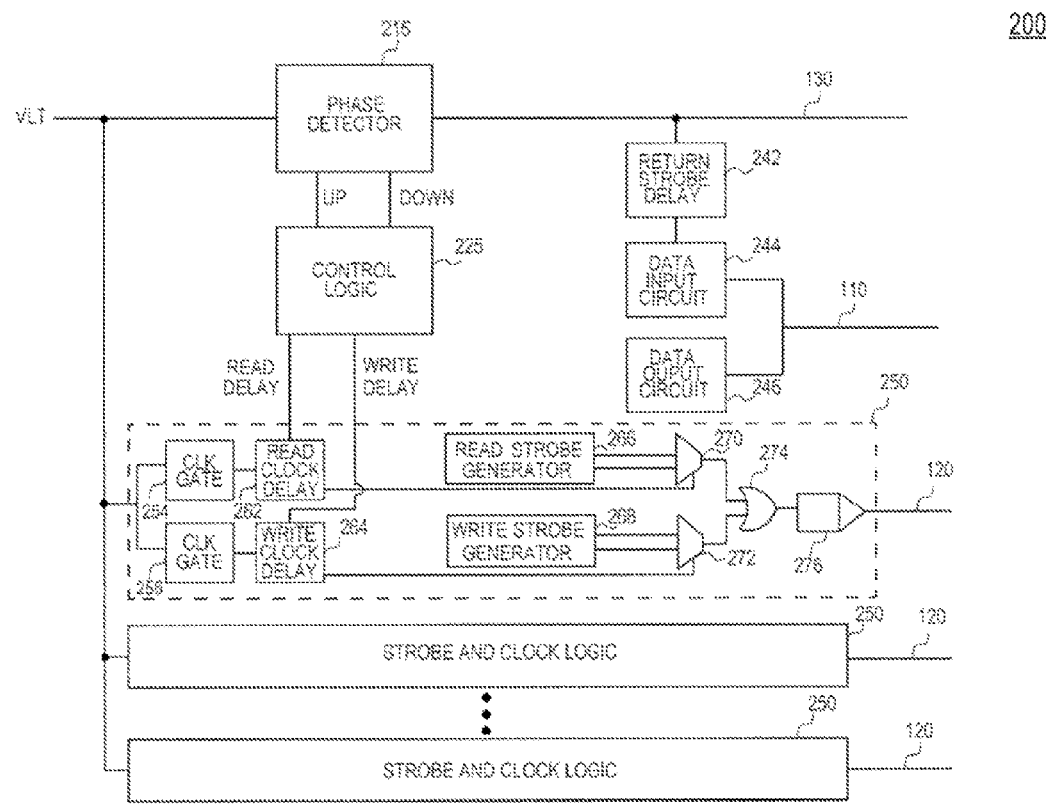
FIG. 2 is a block diagram of a memory controller according to an embodiment of the present invention.

FIG. 2 is a block diagram of a memory controller 200 according to an embodiment of the present invention. The memory controller 200 may be used to implement the memory controller 102 of FIG. 1. The memory controller 200 may include a phase detector 215, a control logic 225, and a plurality of strobe and clock logic circuits 250 for providing timing strobe signals, for example, to memories (e.g., memories 104 of FIG. 1). As will be described in more detail below, the timing strobe signals may be provided having respective delays to change the timing of memory operations. The memory controller 200 may further include a return strobe delay circuit 242, a data input circuit 244, and a data output circuit 246.

The phase detector 215 may be configured to receive the input clock signal VLT and further may receive return strobe signals over the bus 130. The phase detector 215 may be configured to compare the input clock signal VLT and each return strobe signal to determine a respective phase difference relative to the input clock signal VLT. Based on the phase differences, the phase detector 215 may provide control signals UP and DOWN. As will be described, the UP and DOWN control signals may be used to adjust respective delays of timing strobe signals provided by the memory controller 200. For example, assertion of the UP control signal may indicate that a delay is to be increased and the DOWN control signal may indicate that a delay is to be decreased. Adjusting the delays in this manner may adjust the respective phase differences of the input clock signal VLT and return strobe signals of a memory 104.

The control logic 225 may be coupled to the phase detector and may be configured to receive the UP and DOWN control signals, and provide control signals READ DELAY and WRITE DELAY to control the respective delays for the timing strobe signals. In particular, the READ DELAY control signal may be provided to control the delay timing strobe signals associated with read operations and the WRITE DELAY control signal may be provided to control a delay for timing strobe signals associated with write operations. The control logic 225 may be configured to track which memory 104 is being accessed during a respective read operation or write operation to which a timing strobe signal is provided and from which the return strobe signal is provided to the phase detector 215, and adjust delays of timing strike signals for the memory associated with the return strobe signal responsive to the UP and DOWN control signals. In this manner, the control logic 225 may individually adjust delays of timing strobe signals for each memory 104 based, at least in part, on the UP and DOWN control signals provided by the phase detector 215.

The data input circuit 244 and the data output circuit 246 may be configured to receive data from and provide data to the bus 110, respectively, as described above, for example, in response to memory operations. The return strobe delay circuit 242 may be configured to receive and delay return strobe signals provided over the bus 130. As described with respect to the memory controller 102 of FIG. 1, read data may be captured responsive to a return strobe signal. Accordingly, the return strobe delay circuit 242 may delay return strobe signals such that return strobe signals are substantially center aligned with data provided to the data input circuit 244 over the bus 110. In this manner, data may be captured responsive to a center aligned strobe signal.

Each of the plurality of strobe and clock logic circuits 250 may correspond to a respective memory, such as a memory 104 of FIG. 1, and accordingly may be configured to provide timing strobe signals to the respective memory. A strobe and clock logic circuit 250 may include clock gates 254 and 256, a read clock delay circuit 262, a write clock delay circuit 264, a read strobe generator circuit 266, and a write strobe generator circuit 268. Multiplexers 270, 272, an OR-gate 274, and a transmission gate 276 may further be included in the strobe and clock logic circuit 250.

Clock gates 254 and 256 may include a buffer, inverter, and/or any other logic gate, and may be configured to receive and/or buffer the clock signal VLT. The clock gates 254 and 256 may be configured to control the provision of the input clock signal VLT to the read clock delay circuit 262 and the write dock delay circuit 264, respectively. The read clock delay circuit 262 may be configured to receive the input clock signal VLT from the dock gate 254 and further may receive the READ DELAY control signal from the control logic 225. The read dock delay circuit 262 may delay the input clock signal VLT based on a delay indicated by the READ DELAY control signal. Similarly, the write clock delay circuit 264 may be configured to receive the input clock signal VLT from the clock gate 256 and further may receive a WRITE DELAY control signal from the control logic 225. The write clock delay circuit 262 may delay the input clock signal based on a delay indicated by the WRITE DELAY control signal. In some examples, the delay indicated by the WRITE DELAY control signal may be different than the delay indicated by the READ DELAY control signal. For example, the delay indicated by the WRITE DELAY control signal may be less than the delay indicated by the READ DELAY control signal, such as half of the delay.

The read strobe generator circuit 266 may be configured to provide logic high and logic low signals to the multiplexer 270. Based, at least in part, on the delayed input clock signal VLT provided by the read clock delay circuit 262, the multiplexer 270 may selectively provide the logic high signal or the logic low signal to provide as timing strobe signal for a read operation. Similarly, the write strobe generator circuit 268 may be configured to provide logic high and logic low signals to the multiplexer 272. Based, at least in part, on the delayed input clock signal VLT provided by the write clock delay circuit 264, the multiplexer 272 may providing either the logic high signal or the logic low signals to provide a timing strobe signal for a write operation. In some examples, the read strobe generator circuit 266 and the write strobe generator circuit 268 may be configured to provide the logic high and logic low signals when needed for read and write operations, respectively. In this manner, logic high and logic low signals may be provided only as needed such that power may be conserved during operation. Additionally or alternatively, in some examples, one or more other elements of the plurality of strobe and clock logic circuits 250 may provide signals only when needed for respective operations.

Timing strobe signals provided by either of the multiplexers 270, 272 may be provided to the OR-gate 274 and subsequently to the transmission gate 276 which may in turn provide timing strobe signals to the bus 120. In some examples, the transmission gate 276 may be configured to provide each timing strobe signal to the bus 120 responsive to a control signal (not shown) provided by control logic, such as the control logic 225.

In an example read operation, the control logic 225 may determine which memory 104 is to be accessed. In response, the clock gate 254 of the strobe and clock logic circuit 250 associated with the memory being accessed may provide the input clock signal VLT to the read clock delay circuit 262. The read strobe generator circuit 266 may provide logic high and logic low signals to the multiplexer 270. In response to the delayed input clock signal, the multiplexer 270 may selectively provide the logic high and logic low signals to provide a timing strobe signal. As described, the timing strobe signal may comprise a periodic signal. The timing strobe signal may be provided to the OR-gate 274 and to the transmission gate 276 and provided over a respective bus 120 to the memory 104 to be accessed. The memory 104 may receive the timing strobe signal over the bus 120 and may access data responsive to the timing strobe signal. The timing strobe signal further may be used by the memory 104 to provide a return strobe signal with the accessed data. The return strobe signal and the accessed data may be provided to the memory controller 102 over the busses 130 and 110, respectively. In some examples, the data and the return strobe signal may be edge aligned.

The return strobe delay circuit 242 may receive and delay the return strobe signal to provide a delayed return strobe signal. The return strobe delay circuit 242 may delay the return strobe signal, for example, by as quarter clock cycle of the input clock signal VLT, or in some embodiments, may delay the return strobe signal by any other amount. The data input circuit 244 may receive the data from the memory 104 and the delayed return strobe signal and may capture the data responsive to the delayed return strobe signal. As described, delaying the return strobe signal in this manner may cause the data input circuit 244 to capture data responsive to a center aligned data strobe signal.

The phase detector 215 may receive the return strobe signal and the input clock signal VLT, and may compare the return strobe signal and the input clock signal VLT to determine a phase difference between the input clock signal VLT and the return strobe signal. Based on the phase difference, the phase detector 215 may provide an UP control signal or DOWN control signal to adjust the delay of timing strobe signals for the memory 104 associated with the read operation. By way of example, if the return strobe signal is leading the input clock signal VLT by more than a threshold (e.g., 45 degrees), the phase detector 215 may provide an UP control signal to increase the delay of timing strobe signals, and if the return strobe signal is lagging the input clock signal VLT by more than a threshold, the phase detector 215 may provide a DOWN control signal to decrease the delay of timing strobe signals. The control logic 225 may receive the UP and DOWN control signals provided by the phase detector 215 and adjust the delays of timing strobe signals accordingly. The control logic 225 may, for instance, adjust the respective delays of the read clock delay 262 and the write clock delay 264 for the timing strobe signals provided in read and write operations. For example, in response to an UP control signal or a DOWN control signal, the control logic 225 may adjust the delay of the read clock delay circuit 262 provided in association with read operations by a first amount and may adjust the delay of the write clock delay circuit 264 provided in association with write operations by a second amount. In some examples, adjustments to the delay of the read clock delay circuit 262 and/or the write clock delay circuit 264 may range from no delay to the width of a full data eye.

In this manner, delays for timing strobe signals associated with both read and write operations may be adjusted. In some examples, delays may be adjusted for each memory 104 individually such that the phase difference of the input clock signal VLT and return strobe signals provided by each memory 104 is substantially the same. The timing strobe signals are provided to the respective memories 104 with a timing that results in the return strobe signals (as well as any accessed data) being provided to the memory controller 200 at substantially the same time. As a result, the timing of each memory 104 can be adjusted to compensate for the specific sensitivities and operating conditions of each particular memory 104 so that accessed data is nonetheless provided to the memory controller 200 substantially aligned. In some examples, delays may be adjusted during an initialization procedure and/or may be adjusted during operation.

In an example write operation, the control logic 225 may determine which memory 104 is to be accessed. In response, the clock gate 256 of the strobe and clock logic circuit 250 associated with the memory being accessed may provide the input clock signal VLT to the write clock delay circuit 264. The delay provided by the write clock delay 264 is indicated by the WRITE DELAY control signal. As previously discussed, the delay indicated by the WRITE DELAY control signal may be different than the delay indicated by the READ DELAY signal. The write strobe generator 268 may provide logic high and logic low signals to the multiplexer 272. In response to the delayed input clock signal, the multiplexer 272 may selectively provide the logic high and logic low signals to provide a timing strobe signal. The timing strobe signal may be provided to the OR-gate 274 and to the transmission gate 276 and provided over a respective bus 120 to the memory 104 associated with the write operation. The memory controller 102 may further provide data to the memory 104 from the data output circuit 246 and over the bus 110. In some examples the memory controller 102 may be configured to provide the write data prior to providing the timing strobe signal such that the timing strobe signal may be center aligned with the data. In this manner, the memory 104 may capture and store the write data responsive to a center aligned strobe signal.

While READ DELAY control signals and WRITE DELAY control signals are shown in FIG. 2 as being provided only to a single strobe and clock logic 250, it will be appreciated that respective READ DELAY and WRITE DELAY control signals may be provided to each strobe and clock logic 250 and that illustration of these signals has been omitted for the purposes of clarity.

Figure 3:
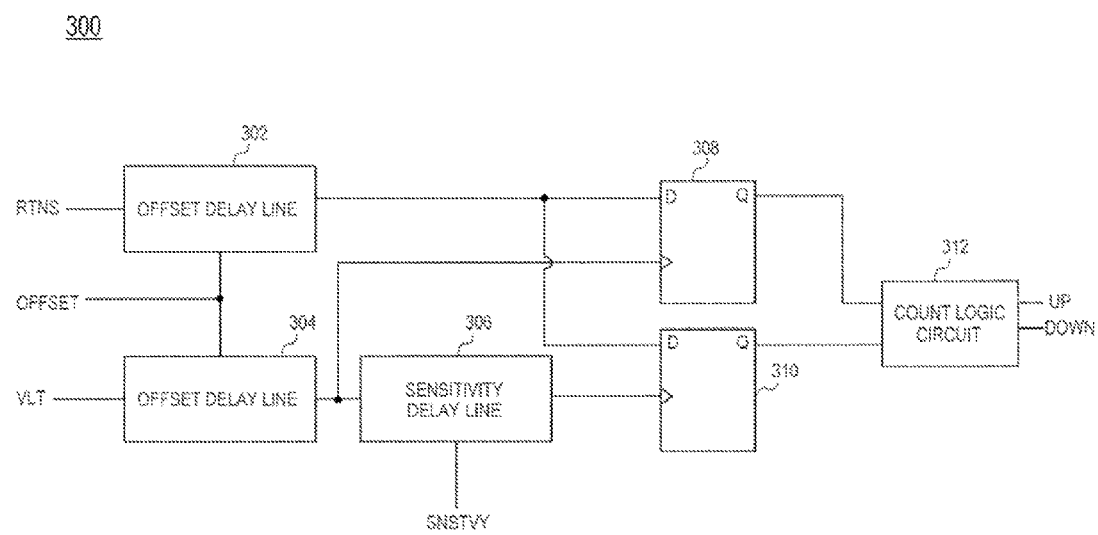
FIG. 3 is a block diagram of a phase detector according to an embodiment of the present invention.

FIG. 3 is a block diagram of a phase detector 300 according to an embodiment of the present invention. The phase detector 300 may be used to implement the phase detector 215 of FIG. 2. The phase detector 300 may include offset delay lines 302, 304, a sensitivity delay line 306, flip-flops 308, 310, and a count logic circuit 312.

The offset delay line 302 may be configured to receive and delay a return strobe signal RTNS and the offset delay line 304 may be configured to receive and delay the clock signal VLT. Each delay line 302, 304 may be configured to delay a respective signal based on a control signal OFFSET. For example, the control signal OFFSET may indicate a delay amount for each delay line 302, 304 such that the return strobe signal RTNS and the clock signal VLT may be delayed a particular amount relative to one another. The delay of the offset delay line 302 and the delay of the offset delay line 304 may be adjusted to adjust the relative delay between the return strobe signal RTNS and the clock signal VLT. In at least one embodiment, each of the delay lines 302, 304 may include a plurality of delay elements, each of which may selectively be enabled based, at least in part, on the control signal OFFSET. The control signal OFFSET may be provided by an external device, such as a controller (not shown). The control signal OFFSET may include signals to individually and separately adjust the delay of the offset delay line 302 and the delay of the offset delay line 304. Adjusting the delays of the offset delay lines 302 and 304 may provide flexibility in adjusting the phase relationship between the delayed RTNS signal and the delayed VLT signal.

The offset delay line 302 may delay the return strobe signal RTNS to provide an offset strobe signal, which may be provided to the D inputs of the flip-flops 308, 310. The offset delay line 304 may delay the clock signal VLT to provide an offset clock signal, which may be provided to the sensitivity delay line 306 and a clock input of the flip-flop 308.

The sensitivity delay line 306 may be configured to receive the offset clock signal and delay the offset clock signal based on a control signal SNSTVY. The sensitivity delay line 306 may be configured to delay the offset clock signal to provide a delayed clock signal to the clock input of the flip-flop 310. Based on respective clock signals received from the offset delay line 304 and sensitivity delay line 306, and the offset strobe signal received from the offset delay line 302, each of the flip-flops 308, 310 may provide an output signal to the count logic circuit 312. The logic levels (e.g., high or low logic levels) of the signals provided by the flip-flops 308, 310 may represent the phase relationship between the offset return strobe signal and the offset input clock signal from the offset delay lines 302 and 304, for example, whether one offset signal is leading, lagging, or suitably in-phase with the other offset signal. Based on the logic levels of the output signals received from the flip-flops 308, 310, the count logic circuit 312 may provide respective control signals UP and DOWN. As described, the control signals UP and DOWN may be provided to control logic to adjust the delays of timing strobe signals provided to a memory 104.

In an example operation of the phase detector 300, the offset delay line 302 may delay the return strobe signal RTNS based on the control signal OFFSET to provide an offset return strobe signal, and the offset delay line 304 may delay the input clock signal VLT based on the control signal OFFSET to provide an offset input clock signal. In this manner, a desired phase difference of the input clock signal VLT and the return strobe signal may be achieved based on a phase difference specified by the control signal OFFSET. The sensitivity delay line 306 may delay the offset input clock signal based on the control signal SNSTVY to provide a delayed clock signal. The sensitivity delay line 306 may be used to provide control over the range for acceptable phase difference of the phase detector 300. For example, in at least one embodiment, the greater the delay applied by the sensitivity delay line 306, the larger the range of acceptable phase difference before the phase detector 300 provides an UP control signal or DOWN control signal.

The flip-flops 308, 310 may receive the offset return strobe signal at their respective D inputs and provide the offset return strobe signal responsive to the offset input clock signal and delayed input clock signal, respectively. The count logic circuit 312 may receive the return strobe signals from each of the flip-flops 308, 310, and provide one or more control signals UP or one or more control signals DOWN based on the return strobe signals. For example, based on the return strobe signals provided by the flip-flops 308, 310, the count logic circuit 312 may determine the phase difference of the input clock signal VLT and return strobe signal RTNS, and may provide the UP and DOWN control signals to adjust delays of timing strobe signals to maintain the phase difference of the input clock signal VLT and return strobe signal RTNS within an acceptable range, as specified by the control signal SNSTVY, of phase difference, as specified by the control signal OFFSET.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed:

1. An apparatus comprising:
   a memory controller configured to produce first and second timing strobe signals;
   a first memory configured to receive the first timing strobe signal and produce a first return strobe signal in response, at least in part, to the first timing strobe signal, the first memory being further configured to provide first read data; and
   a second memory configured to receive the second timing strobe signal and produce a second return strobe signal in response, at least in part, to the second timing strobe signal, the second memory being further configured to provide second read data;
   the memory controller being further configured to capture the first read data in response, at least in part, to the first return strobe signal and the second read data in response, at least in part, to the second return strobe signal.

2. The apparatus as claimed in claim 1, further comprising first and second buses, each of the first and second return strobe signal being conveyed through the first bus, and each of the first and second read data being conveyed through the second bus.

3. The apparatus as claimed in claim 2, further comprising third and fourth buses, the first timing strobe signal being conveyed through the third bus, and the second timing strobe signal being conveyed through the fourth bus.

4. The apparatus as claimed in claim 1, wherein the memory controller comprises a first terminal from which the first timing strobe signal is produced, a second terminal from which the second timing strobe signal is produced, a third terminal supplied with each of the first and second return strobe signals, and a fourth terminal supplied with each of the first and second read data.

5. The apparatus as claimed in claim 1, wherein the memory controller is configured to receive a clock signal, each of the first and second timing strobe signals being produced in response, at least in part, to the clock signal.

6. The apparatus as claimed in claim 5, wherein the memory controller is configured to compare in phase the clock signal with the first return strobe signal to control the first timing strobe signal and with the second return strobe signal to control the second timing strobe signal.

7. An apparatus comprising:
   a first circuit producing first and second timing strobe signals;
   a second circuit receiving first and second return strobe signals, the first return strobe signal being produced in response, at least in part, to the first timing strobe signal, and the second return strobe signal being produced in response, at least in part, to the second timing strobe signal; and
   a third circuit receiving first and second data signals, the first data signal being accompanied by the first return strobe signal, and the second data signal being accompanied by the second return strobe signal.

8. The apparatus as claimed in claim 7, wherein the second circuit comprises a first input terminal supplied in common with the first and second return strobe signals, and the third circuit comprises a second input terminal supplied in common with the first and second data signals.

9. The apparatus as claimed in claim 8, wherein the first circuit comprises a first output terminal from which the first timing strobe signal is produced and a second output terminal from which the second timing strobe signal is produced.

10. The apparatus as claimed in claim 8, wherein the first data signal is captured in response, at least in part, to the first return strobe signal, and the second data signal is captured in response, at least in part, to the second return strobe signal.

11. The apparatus as claimed in claim 7, wherein the apparatus comprises a memory controller and first and second memories, the memory controller comprises the first, second and third circuits, the first memory producing the first return strobe signal and the first data signal, and the second memory producing the second return strobe signal and the second data signal.

12. A method comprising:
   providing a first timing strobe signal;
   providing a first data signal accompanied by a first return strobe signal, the first return strobe signal being produced in response, at least in part, to the first timing strobe signal;
   capturing the first data signal in response, at least in part, to the first return strobe signal;
   providing a second timing strobe signal;
   providing a second data signal accompanied by a second return strobe signal, the second return strobe signal being produced in response, at least in part, to the second timing strobe signal; and
   capturing the second data signal in response, at least in part, to the second return strobe signal.

13. The method as claimed in claim 12, further comprising:
   receiving a clock signal; and
   comparing in phase the clock signal with the first return strobe signal to control the first timing strobe signal and with the second return strobe signal to control the second timing strobe signal.

14. The method as claimed in claim 12, wherein the providing the first timing strobe signal, the capturing the first data signal, the providing the second timing strobe signal and the capturing the second data signal are performed by a memory controller; the providing the first data signal accompanied by the first return strobe signal is performed by a first memory; and the providing the second data signal accompanied by the second return strobe signal is performed by a second memory.

15. The method as claimed in claim 14, further comprising receiving the first and second return strobe signals, and wherein the receiving the first and second return strobe signals is performed by the memory controller.

\* \* \* \* \*